(12) United States Patent
Muri et al.

(10) Patent No.: US 11,652,138 B2
(45) Date of Patent: May 16, 2023

(54) METHOD FOR PRODUCING A SUPERJUNCTION DEVICE

(71) Applicant: Infineon Technologies Austria AG, Villach (AT)

(72) Inventors: Ingo Muri, Villach (AT); Felix Schubert, Dresden (DE); Daniel Tutuc, St. Niklas an der Drau (AT); Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/330,681

(22) Filed: May 26, 2021

(65) Prior Publication Data

US 2021/0376064 A1 Dec. 2, 2021

(30) Foreign Application Priority Data

May 27, 2020 (EP) .................................. 20176749

(51) Int. Cl.
*H01L 29/06* (2006.01)
*H01L 29/66* (2006.01)
*H01L 21/265* (2006.01)
*H01L 21/324* (2006.01)
*H01L 21/225* (2006.01)
(Continued)

(52) U.S. Cl.
CPC ...... *H01L 29/0634* (2013.01); *H01L 21/2253* (2013.01); *H01L 21/26513* (2013.01); *H01L 21/26586* (2013.01); *H01L 21/324* (2013.01); *H01L 29/0696* (2013.01); *H01L 29/0878* (2013.01); *H01L 29/66712* (2013.01); *H01L 29/66734* (2013.01); *H01L 29/7802* (2013.01); *H01L 29/7805* (2013.01); *H01L 21/223* (2013.01); *H01L 21/30604* (2013.01);
(Continued)

(58) Field of Classification Search
CPC .......... H01L 29/0634; H01L 29/66712; H01L 21/26513; H01L 29/7802; H01L 29/66666
See application file for complete search history.

(56) References Cited

U.S. PATENT DOCUMENTS

6,649,459 B2 * 11/2003 Deboy ................ H01L 29/0649 257/E29.066
9,070,580 B2 * 6/2015 Willmeroth ......... H01L 29/7396
(Continued)

*Primary Examiner* — Bilkis Jahan
*Assistant Examiner* — Victor V Barzykin
(74) *Attorney, Agent, or Firm* — Murphy, Bilak & Homiller, PLLC (57) ABSTRACT

A method for producing a semiconductor device includes forming transistor cells in a semiconductor body, each cell including a drift region separated from a source region by a body region, a gate electrode dielectrically insulated from the body region, and a compensation region of a doping type complementary to the doping type of the drift region and extending from a respective body region into the drift region in a vertical direction. Forming the drift and compensation regions includes performing a first implantation step, thereby implanting first and second type dopant atoms into the semiconductor body, wherein an implantation dose of at least one of the first type dopant atoms and the second type dopant atoms for each of at least two sections of the semiconductor body differs from the implantation dose of the corresponding type of dopant atoms of at least one other section of the at least two sections.

15 Claims, 6 Drawing Sheets

(51) Int. Cl.
    *H01L 29/08*     (2006.01)
    *H01L 29/78*     (2006.01)
    *H01L 29/16*     (2006.01)
    *H01L 29/167*     (2006.01)
    *H01L 21/223*     (2006.01)
    *H01L 21/306*     (2006.01)

(52) U.S. Cl.
    CPC ........ *H01L 29/167* (2013.01); *H01L 29/1608* (2013.01); *H01L 29/7813* (2013.01)

(56) References Cited

U.S. PATENT DOCUMENTS

| | | | |
|---|---|---|---|
| 9,570,596 B2* | 2/2017 | Gamerith | H01L 29/1095 |
| 9,620,585 B1* | 4/2017 | Loechelt | H01L 29/66666 |
| 10,074,715 B2* | 9/2018 | Schustereder | H01L 22/14 |
| 2004/0077149 A1* | 4/2004 | Renau | H01L 21/266 |
| | | | 257/E21.336 |
| 2007/0177444 A1* | 8/2007 | Miyajima | H01L 29/0634 |
| | | | 365/221 |
| 2014/0231912 A1* | 8/2014 | Willmeroth | H01L 29/7395 |
| | | | 257/339 |
| 2014/0327068 A1* | 11/2014 | Gamerith | H01L 29/7811 |
| | | | 257/329 |
| 2014/0327070 A1* | 11/2014 | Hirler | H01L 29/7813 |
| | | | 257/329 |
| 2015/0214348 A1* | 7/2015 | Gamerith | H01L 29/66712 |
| | | | 257/329 |
| 2017/0069712 A1* | 3/2017 | Schustereder | H01L 21/265 |
| 2018/0019132 A1* | 1/2018 | Mauder | H01L 29/66712 |
| 2018/0294332 A1* | 10/2018 | Loechelt | H01L 29/66734 |
| 2019/0326431 A1* | 10/2019 | Yilmaz | H01L 29/66712 |

* cited by examiner

METHOD FOR PRODUCING A SUPERJUNCTION DEVICE

TECHNICAL FIELD

This disclosure in general relates to a method for producing a superjunction device, in particular for producing a drift region with n-type regions and p-type regions in a superjunction device.

BACKGROUND

A superjunction device, which often is also referred to as compensation device, includes a drift region with at least one region of a first doping type (first conductivity type) and at least one region of a second doping type (second conductivity type) complementary to the first doping type. The at least one region of the first doping type may also be referred to as drift region and the at least one region of the second doping type may also be referred to as compensation region.

A superjunction device can be operated in an on-state and an off-state. The on-state is an operation mode in which a current can flow in a current flow direction through the first doping type region. The off-state is an operation mode in which a pn-junction between the at least one first doping type region and the at least one second doping type region is reverse biased so that a space charge region (depletion region) expands in each of these doped regions in directions that are substantially perpendicular to the current flow direction.

A voltage blocking capability of a superjunction device is, inter alia, dependent on how well the amount of first type doping atoms in the first doping type region is adapted to the amount of second type doping atoms in the second doping type region. More precisely, the voltage blocking capability is dependent on how well the amount of first type doping atoms is adapted to the amount of second type doping atoms at each position in the current flow direction of the drift region. One device may include sections of the drift region where the amount of first type doping atoms and the amount of second type doping atoms is completely balanced, sections where the amount of first type doping atoms exceeds the amount of second type doping atoms, and/or sections where the amount of second type doping atoms exceeds the amount of first type doping atoms.

The amount of first type doping atoms and/or second type doping atoms in a certain section generally depends on a position of the concerned section in the device. During production steps which follow an implantation of the doping atoms, a certain amount of doping atoms involuntarily may pass into a gaseous phase and leave the semiconductor body (so-called outgassing). A variation from a desired amount after the concerned production steps generally varies systematically depending on the position of the concerned section in the device. It is desirable to exactly control the amount of first type and second type doping atoms introduced into the drift region during a manufacturing process for all positions.

SUMMARY

One example relates to a method for producing a semiconductor device, the method including forming a plurality of transistor cells in a semiconductor body, each transistor cell comprising a source region, a body region, a drift region separated from the source region by the body region, a gate electrode dielectrically insulated from the body region, and a compensation region of a doping type complementary to the doping type of the drift region and extending from a respective body region into the drift region in a vertical direction. Forming the plurality of drift regions and the plurality of compensation regions includes performing a first implantation step, thereby implanting dopant atoms of a first type and dopant atoms of a second type into the semiconductor body, wherein an implantation dose of at least one of the first type dopant atoms and the second type dopant atoms for each of at least two sections of the semiconductor body differs from the implantation dose of the corresponding type of dopant atoms of at least one other section of the at least two sections.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
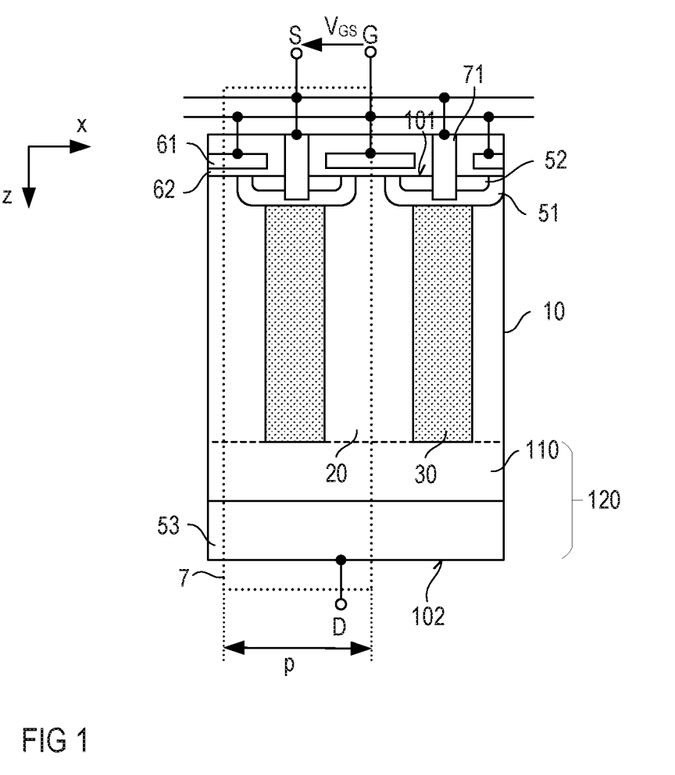
FIG. 1 schematically illustrates the general structure of a semiconductor device comprising drift regions and compensation regions.

FIG. 1 schematically illustrates a vertical cross-sectional view of a superjunction device comprising a semiconductor body 10. The semiconductor body 10 may include a conventional semiconductor material such as, for example, silicon (Si), silicon carbide (SiC), gallium nitride (GaN), gallium arsenide (GaAs), or the like. A transistor device is formed in the semiconductor body 10. In FIG. 1, only a small section of the transistor device is shown. The semiconductor body 10 includes at least one working transistor cell 7 with a gate electrode 61 that is dielectrically insulated from a body region 51 by a gate dielectric 62. The body region 51 is a doped semiconductor region of the semiconductor body 10. In the example illustrated in FIG. 1, the body region 51 extends from a first surface 101 into the semiconductor body 10, and the gate electrode 61 is arranged above the first surface 101 of the semiconductor body 10. Each of the transistor cells 7 further includes at least one source region 52 extending from the first surface 101 into the body region 51.

The transistor device illustrated in FIG. 1 further includes a drift region 20 formed in the semiconductor body 10. The drift region 20 adjoins the body region 51 of the at least one transistor cell 7 and forms a pn-junction with the body region 51. The drift region 20 is arranged between the body region 51 of the at least one transistor cell 7 and a semiconductor layer 120. The semiconductor layer 120 is arranged between a second surface 102 of the semiconductor body 10 and the drift region 20. The second surface 102 is arranged opposite to the first surface 101 in a vertical direction y of the semiconductor body 10.

The semiconductor layer 120 comprises a drain region 53 of the same doping type as the drift region 20 and adjoining the second surface 102. A vertical field-stop-region 110 of the same doping type as the drift region 20 and the drain region 53, but less highly doped than the drain region 53, may be arranged between the drift region 20 and the drain region 53. That is, the semiconductor layer 120 may be formed by the drain region 53 and the adjoining vertical field-stop-region 110, as is illustrated in FIG. 1. The vertical field-stop-region 110 may be formed by a single layer or by a plurality of separate sub-layers, e.g., at least two sub-layers. Sub-layers that are arranged closer to the drift region 20 may be less highly doped than sub-layers that are arranged further away from the drift region 20. For example, a doping concentration of a sub-layer that is arranged adjacent to the drift region 20 may be selected from a range of between 1E15 and 1E16 cm$^{-3}$ or lower. A doping concentration of a sub-layer that is arranged adjacent to the drain region 53 may be higher than a doping concentration of a sub-layer that is arranged horizontally above. The doping concentration of the sub-layer that is arranged adjacent to the drain region 53, however, may be lower than a doping concentration of the drain region 53. Generally speaking, a doping concentration of the different sub-layers may increase from the drift region 20 towards the drain region 53.

Still referring to FIG. 1, the transistor device includes at least one vertical compensation region 30 of a doping type complementary to the doping type of the drift region 20. According to one example, the transistor device includes a plurality of transistor cells 7 and each transistor cell 7 includes a vertical compensation region 30 adjoining the body region 51 of the respective transistor cell 7. In a vertical direction z of the semiconductor body 10, which is a direction perpendicular to the first surface 101 and to the second surface 102, the at least one vertical compensation region 30 extends from the body region 51 into the semiconductor body 10 towards the semiconductor layer 120.

Still referring to FIG. 1, the transistor device further includes a source electrode S. The source electrode S is electrically connected to the at least one source region 52 and the body region 51 of the at least one transistor cell 7 by means of contact plugs 71. The contact plugs 71 may comprise at least one of polysilicon, tungsten, aluminum, copper, and a Ti/TiN barrier liner, for example. This source electrode S forms a source node or is electrically connected to a source node of the transistor device. The transistor device further includes a drain node D electrically connected to the drain region 53. A drain electrode electrically connected to the drain region 53 may form the drain node D.

The transistor device can be an n-type transistor device or a p-type transistor device. The device type is defined by the doping type of the at least one source region 52. In an n-type transistor device, the source region 52 is an n-type region, the body region 51 is a p-type region, the drift region 20, which has a doping type complementary to the doping type of the body region 51, is an n-type region, and the at least one vertical compensation region 30 is a p-type region. In a p-type transistor device, the source region 52 is a p-type region, the body region 51 is an n-type region, the drift region 20 is a p-type region, and the at least one vertical compensation region 20 is an n-type region. The transistor device can be implemented as a MOSFET, for example. In a MOSFET, the drain region 53 has the same doping type as the drift region 20, as has been described above. For example, a doping concentration of the drain region 53 is selected from a range of between 1E18 and 1E19 cm$^{-3}$, 1E18 and 1E20 cm$^{-3}$, or 1E18 and 1E21 cm$^{-3}$, doping concentrations of the drift region 20 and the vertical compensation region 30 are selected from a range of between 1E15 and 8E16 cm$^{-3}$, and a doping concentration of the body region 51 is selected from between 5E16 cm$^{-3}$ and 1E18 cm$^{-3}$. The transistor cells 7 illustrated in the Figures are planar transistor cells. Implementing the transistor cells 7 as planar transistor cells, however, is only one example. According to another example (not specifically illustrated) the transistor cells 7 are implemented as trench transistor cells. That is, the at least one gate electrode 61 is arranged in a trench that extends from the first surface 101 into the semiconductor body 10.

In the transistor device explained above, a plurality of transistor cells 7 is connected in parallel. That is, the source regions 52 of these transistor cells 7 are connected to the source node S, the common drain region 53 is connected to the drain node D, and the at least one gate electrode 61 is connected to a gate node G.

The drift regions 20 and the compensation regions 30 form an arrangement of vertical columns in the semiconductor body 10. The doping type of the compensation regions 30 is opposite to the doping type of the drift regions 20. The drift regions 20 may be formed by implanting dopant atoms of a first type into the semiconductor body 10, and the compensation regions 30 may be formed by implanting dopant atoms of a second type into the semiconductor body 10.

Measurements have revealed that in the finished semiconductor device in some sections of the semiconductor body 10 a doping concentration may be lower than in other sections. In particular, in the finished semiconductor device there may be certain sections wherein a doping concentration of the drift regions 20 is higher than the doping concentration of drift regions 20 in other sections of the semiconductor body 10. For example, a doping concentration of the drift region 20 in some transistor cells 7 may be higher than the doping concentration of the drift region 20 in other transistor cells 7. The same applies for the compensation regions 30. That is, within one semiconductor body 10, a doping concentration of at least one of the drift regions 20 and the compensation regions 30 may differ between different transistor cells 7. A doping concentration may also differ between different semiconductor bodies 10 treated in the same production process. Such undesirable variations of the doping concentration generally vary systematically.

The variations of the doping concentration may occur due to an effect which may be referred to as outgassing. During certain production processes, doping atoms that were implanted into the semiconductor before, may enter the gaseous phase and leave the semiconductor body. This outgassing usually occurs when the semiconductor body 10 is exposed to high temperatures. A temperature within a processing chamber may not be constant for each position within the processing chamber. In many cases, the temperature within the processing chamber is higher at some positions, and lower at other positions. Therefore, if a complete wafer is treated within a processing chamber, some areas of the wafer may be heated more than others. Therefore, the outgassing may be more severe in some areas of a wafer or semiconductor body than in others. The specific pattern of the outgassing effect on a single wafer generally depends on the characteristics of the processing chamber. That is, the pattern may be different for different processing chambers. The effect of outgassing will be explained in more detail further below.

The concentration of dopant atoms in the finished semiconductor device may differ radially over the semiconductor body 10. The varying doping concentration may form a rounded pattern, or an oval pattern, for example. Other shapes are generally also possible. This results in several different concentric sections of the semiconductor body 10. The doping concentration of the drift regions 20 and the compensation regions 30 in a single section may be essentially constant. The doping concentration between different sections, however, may differ from each other.

Figure 2:
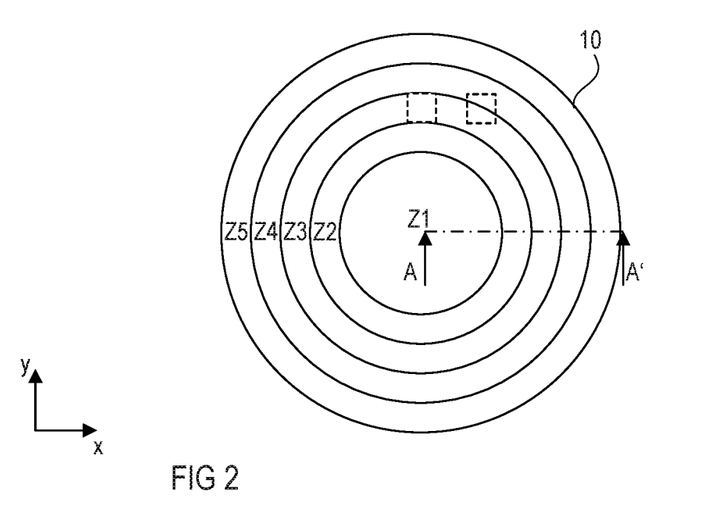
FIG. 2 schematically illustrates different annular sections of a semiconductor body.

Five different annular sections $Z1, Z2, \ldots, Z5$ of a semiconductor body 10 are exemplarily illustrated in FIG. 2. This, however, is only an example. The varying doping concentration may also result in less than five sections or more than five sections. FIG. 2 schematically illustrates a top view of a semiconductor body 10. The semiconductor body 10 may have a round shape, for example. Other shapes, however, are generally also possible. The boundaries between different directly adjoining sections $Z1, Z2, \ldots, Z5$, however, may not always be sharp borders. That is, the doping concentration within one section may increase or decrease continuously within the respective section $Z1, Z2, \ldots, Z5$. In this way, the doping concentration of a first section $Z1$ in an edge region of this section may only be marginally smaller or larger than the doping concentration in an edge region of a second section $Z2$ directly adjoining the first section $Z1$. The boundary line between two adjoining sections $Z1, Z2, \ldots, Z5$ may be determined by defining appropriate thresholds. If, for example, a doping concentration exceeds a certain threshold, the respective area may be assigned to the first section $Z1$, while an area in which the doping concentration is below the threshold may be assigned to the second section $Z2$, or vice versa. In this way, a plurality of different sections $Z1, Z2, \ldots, Z5$ may be defined.

A method for forming a semiconductor device comprises forming a plurality of transistor cells 7 in a semiconductor body 10, each transistor cell 7 comprising a source region 52, a body region 51, a drift region 20 separated from the source region 52 by the body region 51, a gate electrode 61 dielectrically insulated from the body region 51, and a compensation region 30 of a doping type complementary to the doping type of the drift region 20 and extending from a respective body region 51 into the drift region 20 in a vertical direction. In order to compensate any variations of dopant atoms in the drift regions 20 and the compensation regions 30, forming the plurality of drift regions 20 and the plurality of compensation regions 30 comprises performing a first implantation step, thereby implanting dopant atoms of a first type and dopant atoms of a second type into the semiconductor body 10, wherein an implantation dose of at least one of the first type dopant atoms and the second type dopant atoms for each of at least two sections $Z1, Z2, \ldots, Zn$ of the semiconductor body 10 differs from the implantation dose of the corresponding type of dopant atoms of at least one other section of the at least two sections $Z1, Z2, \ldots, Zn$.

That is, immediately after the first implantation step, the doping concentration of the drift regions 20 and compensation regions 30 may vary for different sections $Z1, Z2, \ldots, Zn$ of the semiconductor body 10. However, the initial doping concentrations may change during following production processes due to the effect of outgassing as mentioned above. The first implantation process is configured to compensate for any losses of dopant atoms during following production steps. Therefore, in the finished semiconductor device, a resulting doping concentration in the different drift regions 20 of a single section and of different section of the at least two sections $Z1, Z2, \ldots, Zn$ may be essentially equal. The same applies for the doping concentration of the different compensation regions 30.

Figure 3:
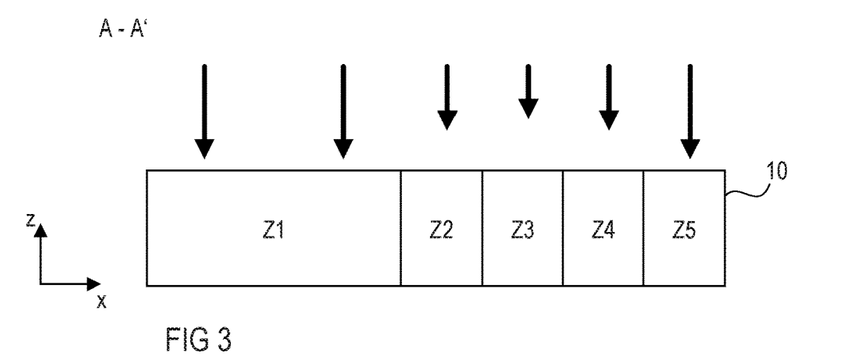
FIG. 3 schematically illustrates an implantation step of a method for forming a semiconductor device according to one example.
Figure 4:
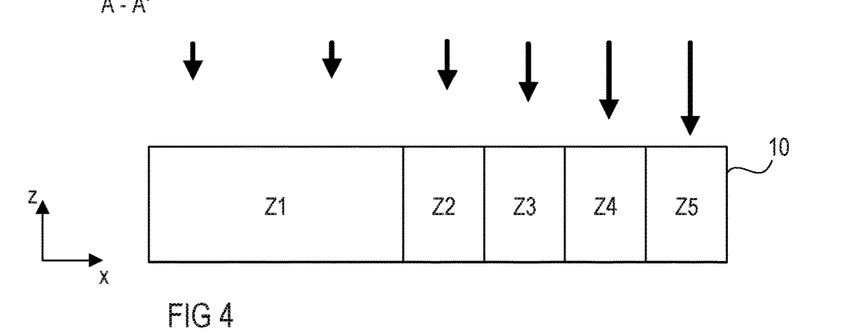
FIG. 4 schematically illustrates an implantation step of a method for forming a semiconductor device according to another example.

Two different first implantation steps are schematically illustrated in the examples of FIGS. 3 and 4 which show cross-sectional views of a semiconductor body 10 in a section-plane A-A' (see FIG. 2). According to a first example, as is illustrated in FIG. 3, an implantation dose for each of at least one of the first type dopant atoms and the second dopant type atoms is comparably high in the center of the semiconductor body 10. That is, an implantation dose in a first section $Z1$ is comparably high. The implantation dose first decreases towards the outer edge of the semiconductor body 10 (zones $Z2$ and $Z3$) before increasing again (zones $Z4$ and $Z5$). According to another example, as is illustrated in FIG. 4, an implantation dose for each of at least one of the first type dopant atoms and the second type dopant atoms may be comparably low in the center of the semiconductor body 10 (first section $Z1$) and may increase towards the outer edge of the semiconductor body 10. That is, an implantation dose implanted into the semiconductor body 10 in the first section $Z1$ is lower than an implantation dose implanted into the semiconductor body 10 in the second section $Z2$, which is in turn lower than an implantation dose implanted into the semiconductor body 10 in the third section $Z3$, and so on. The different patterns are indicated with the bold arrows in FIGS. 3 and 4, wherein a longer arrow represents a higher implantation dose and a shorter arrow indicates a lower implantation dose. The same pattern may be used for different semiconductor bodies 10 that are treated in the same process chambers.

One of the sections $Z1, Z2, \ldots, Zn$ may have a width in a horizontal direction x of several millimeters, for example, wherein different sections $Z1, Z2, \ldots, Zn$ may have the same width or may have different widths. That is, the implantation dose may be chosen to be constant for a width of several millimeters (within at least one section), for example. This, however, is only an example. Other width are also possible. Generally, several transistor cells 7 that are arranged adjacent to each other within in a certain section Z1, Z2, . . . , Zn may receive the same number of dopant atoms. Generally, a semiconductor body 10 may comprise at least two different zones Z1, Z2, . . . , Zn.

In the examples illustrated in FIGS. 3 and 4, a single implantation step is performed with an implantation dose that is different for different sections Z1, Z2, . . . , Zn of a semiconductor body 10. That is, in a single implantation step, 100% of the total implantation dose of each of the first type dopant atoms and the second type dopant atoms are implanted for each of the at least two sections Z1, Z2, . . . , Zn.

Figure 5A:
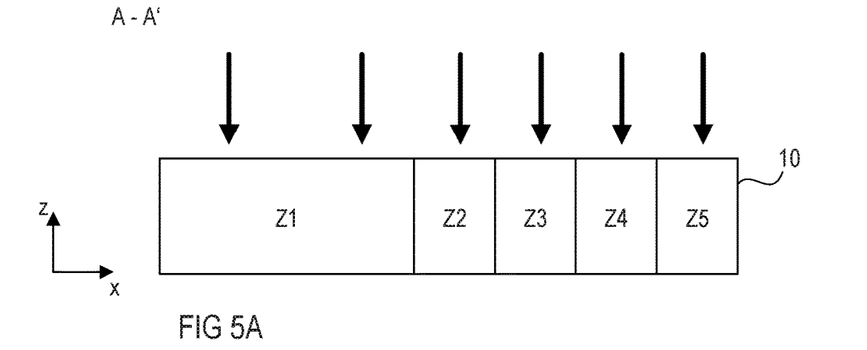
FIGS. 5A and 5B schematically illustrate implantation steps of a method for forming a semiconductor device according to an even further example.
Figure 5B:
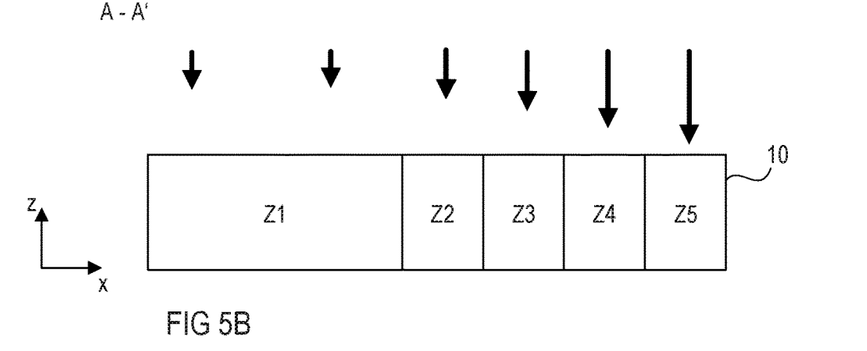

This, however, is only an example. As is illustrated in FIGS. 5A and 5B, it is also possible to perform a first implantation step, wherein dopant atoms of a first type and dopant atoms of a second type are implanted into the semiconductor body 10, wherein an implantation dose of at least one of the first type dopant atoms and the second type dopant atoms for each of at least two sections Z1, Z2, . . . , Zn of the semiconductor body 10 differs from the implantation dose of the corresponding type of dopant atoms of at least one other section of the at least two sections Z1, Z2, . . . , Zn (see FIG. 5B). The implantation pattern illustrated in FIGS. 5A and 5B corresponds to the pattern that has been described with respect to FIG. 4 above. Other patterns, however, are also possible.

A second implantation step may be performed, wherein an implantation dose of the first type dopant atoms of each of the at least two sections Z1, Z2, . . . , Zn of a semiconductor body 10 is equal to the implantation dose of the corresponding type of dopant atoms of each of the other sections Z1, Z2, . . . , Zn, and an implantation dose of the second type dopant atoms of each of the at least two sections Z1, Z2, . . . , Zn is equal to the implantation dose of the corresponding type of dopant atoms of each of the other sections (see FIG. 5A). In this way, a majority of dopant atoms may be implanted into the semiconductor body 10. For example, about 90% to 98% of a total implantation dose of each of the first type dopant atoms and the second type dopant atoms may be implanted for each of the at least two sections Z1, Z2, . . . , Zn during the second implantation step. During the first implantation step, about 2% to 10% of a total implantation dose of each of the first type dopant atoms and the second type dopant atoms may be implanted for each of the at least two sections Z1, Z2, . . . , Zn. In this way, after performing both the first and the second implantation step, 100% of the total implantation dose of each of the first type dopant atoms and the second type dopant atoms are implanted for each of the at least two sections Z1, Z2, . . . , Zn.

The two implantation steps may be performed in any desired order. That is, the first implantation step may be performed before or after the second implantation step. For both implantation steps, an implantation dose of the first type dopant atoms is essentially homogenous within each of the at least two sections Z1, Z2, . . . , Zn, and an implantation dose of the second type dopant atoms is essentially homogenous within each of the at least two sections Z1, Z2, . . . , Zn.

The different sections Z1, Z2, . . . , Zn of the semiconductor body 10, as is exemplarily illustrated in FIG. 2, may be arranged in a radially symmetrical pattern. Therefore, performing the first implantation step may result in a radially symmetrical distribution of at least one of the first type dopant atoms and the second type dopant atoms within the semiconductor body 10.

Often, a plurality of semiconductor bodies 10 is included in a semiconductor wafer. When producing the different semiconductor devices, each of which is included in a separate one of the semiconductor bodies 10, the complete wafer may be treated during the different production steps. That is, a plurality of semiconductor devices may be produced simultaneously. After forming the plurality of semiconductor devices in the semiconductor wafer, the semiconductor wafer may be cut into a plurality of separate semiconductor bodies 10. The resulting variation of the doping concentrations of the drift regions 20 and compensation regions 30, therefore, may occur not only within a single one of the semiconductor bodies 10, but on wafer level instead. That is, the semiconductor body 10 as illustrated in FIG. 2 may instead be an entire semiconductor wafer. The semiconductor wafer may comprise a plurality of different sections Z1, Z2, . . . , Zn, wherein an implantation dose of at least one of the first type dopant atoms and the second type dopant atoms for each of at least two sections Z1, Z2, . . . , Zn of the semiconductor wafer differs from the implantation dose of the corresponding type of dopant atoms of at least one other section of the at least two sections Z1, Z2, Zn. Each of the semiconductor bodies 10 included in the semiconductor wafer may comprise one, two or more sections of the plurality of sections Z1, Z2, . . . , Zn of the entire semiconductor wafer. In this case, the different sections Z1, Z2, . . . , Zn of the semiconductor wafer may be arranged in a radially symmetrical pattern, and performing the first implantation step may result in a radially symmetrical distribution of at least one of the first type dopant atoms and the second type dopant atoms within the semiconductor wafer. Within a single semiconductor body 10, however, the different sections may not be arranged radially symmetrical in this example. In FIG. 2, two different semiconductor bodies that may be cut from a complete wafer are exemplarily illustrated in dashed lines. As can be seen, one of the two semiconductor bodies is arranged completely within a single section Z3 (no variation of the doping concentration occurs within this semiconductor body), while another of the semiconductor bodies is arranged such that it covers parts of two different sections Z3, Z4. This, however, is only an example. A semiconductor body cut from a semiconductor wafer may be smaller or larger with respect to the semiconductor wafer, as is shown in FIG. 2. Even further, the position of the semiconductor bodies in the semiconductor wafer may vary depending on different conditions.

The first implantation step may comprise implanting the first type dopant atoms and the second type dopant atoms simultaneously. However, it is also possible, that the first implantation step includes a first sub-process and a second sub-process, wherein the first type dopant atoms are implanted during the first sub-process and the second type dopant atoms are implanted in the separate second sub-process. The first sub-process and the second sub-process may be performed in any desired order. That is, the first sub-process may either be performed before or after the second sub-process. The same applies for the second implantation step which may comprise implanting the first type dopant atoms and the second type dopant atoms simultaneously. However, it is also possible, that the second implantation step also includes a first sub-process and a second sub-process, wherein the first type dopant atoms are implanted during the first sub-process and the second type dopant atoms are implanted in the separate second sub-process. The first sub-process and the second sub-process of the second implantation step may also be performed in any desired order. That is, the first sub-process may either be performed before or after the second sub-process.

It is possible, that the implantation dose of the first type dopant atoms in all of the at least two sections $Z1$, $Z2, \ldots, Zn$ equals the implantation dose of the second type dopant atoms. According to another example, however, in at least one of the at least two sections $Z1, Z2, \ldots, Zn$ of the semiconductor body 10 the implantation dose of the first type dopant atoms differs from the implantation dose of the second type dopant atoms.

Figure 6A:
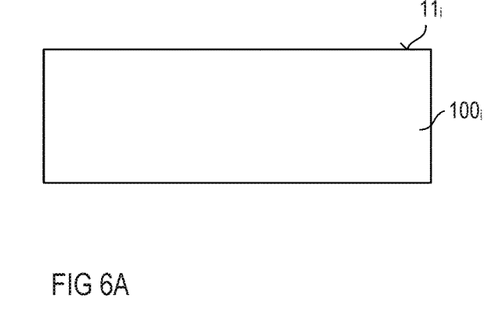
FIGS. 6A-6F illustrate one example of a method for producing a plurality of semiconductor arrangements one above the other, with each semiconductor arrangement including a semiconductor layer, a plurality of trenches in the semiconductor layer, and implanted regions along opposite sidewalls of the trenches.

Now referring to FIGS. 6A through 6F, a method for forming the desired semiconductor structure according to one example is schematically illustrated. Referring to FIG. 6A, the method includes forming a semiconductor layer 100$_i$ with a first surface 11$_i$. FIG. 6A shows a vertical cross-sectional view of the semiconductor layer 100$_i$, that is, a view in a section plane perpendicular to the first surface 11$_i$. According to one example, the semiconductor layer 100$_i$ is a monocrystalline layer and a material of the semiconductor layer 100$_i$ is silicon.

Figure 6B:
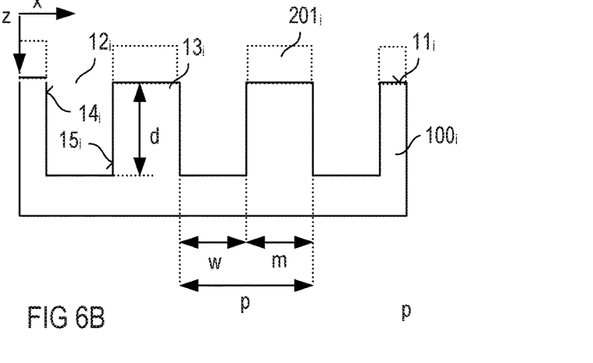

Referring to FIG. 6B, the method further includes forming a plurality of trenches 12$_i$, in the first surface 11$_i$ of the semiconductor layer 100$_i$. According to one example, the trenches 12$_i$ are formed such that they are elongated in a direction perpendicular to the section plane shown in FIG. 6B. "Elongated" means that a length of the trenches 12$_i$ in this direction perpendicular to the section plane is several times a width w of the trenches 12$_i$. According to one example, the length of each of the trenches 12$_i$ is at least 10 (1E1), at least 100 (1E2), at least 1000 (1E3) times, or at least 10000 (1E4) times the width w. According to one example, the trenches 12$_i$ are formed to have an aspect ratio which is a ratio between a depth d and the width w, of between 10:1 and 1:1, in particular between 5:1 and 1:1. The width w of the trenches 12$_i$ is their dimension in a first lateral direction x, and the depth d is their dimension in a vertical direction z. The vertical direction z is perpendicular to the first lateral direction x and the first surface 11$_i$. The lateral direction perpendicular to the section plane shown in FIG. 6B, that is, perpendicular to the first lateral direction x (and the vertical direction z) is referred to as second lateral direction y in the following.

According to one example, the trenches 12$_i$ are formed to have a width w of between 0.5 micrometers (μm) and 9 micrometers, in particular between 1 micrometer and 5 micrometers, or between 1 micrometer and 3 micrometers. Referring to FIG. 6B, the trenches 12$_i$ are separated by mesa regions 13$_i$, which are sections of the semiconductor layer 100$_i$ remaining between the trenches 12$_i$ after the etching process. According to one example, a width m of these mesa regions 13$_i$ in the first lateral direction x is between 0.5 micrometers (μm) and 9 micrometers, in particular between 0.5 micrometers and 5 micrometers, or between 0.5 micrometers and 3 micrometers. A pitch, which is given by the width w of one trench 12$_i$ and the width m of one mesa region 13$_i$ adjoining the respective trench 12$_i$, is between 1 micrometer (μm) and 18 micrometers, in particular between 1.5 micrometers and 9 micrometers.

According to one example, the trenches 12$_i$ have substantially the same width. According to one example, the trenches 12$_i$ are substantially equally spaced in the first lateral direction x of the semiconductor layer 100$_i$, that is, the mesa regions 13$_i$ have substantially the same width m. According to one example, the mesa regions 13$_i$ are slim as compared to the trenches 12$_i$. For example, a width m of the mesa regions 13$_i$ in the first lateral direction x may be between 0.5 micrometers and 3 micrometers, while the trenches 12$_i$ are formed to have a width w of between 6 micrometers and 9 micrometers.

Forming the plurality of trenches 12$_i$ may include forming an etch mask 201$_i$ (illustrated in dashed lines in FIG. 6B) on the first surface 11$_i$ and etching the semiconductor layer 100$_i$ in those regions of the first surface 11$_i$ that are not covered by the etch mask 201$_i$. According to one example, the etching process is a dry etching process. According to another example, the etching process is a wet etching process using an alkaline etchant. Examples of an alkaline etchant include, but are not restricted to, TMAH (Tetramethylammoniumhydroxide), KOH, CaOH, or NH4OH. According to one example, a temperature in the etching process is about 80° C. and a concentration of the etchant is between 20% and 30%, in particular about 25%.

According to one example, the semiconductor layer 100$_i$ is a monocrystalline silicon layer and formed such that the first sidewall 14$_i$ and the second sidewall 15$_i$ run in a $\{100\}$ plane of the crystal lattice of the silicon layer. According to another example, the semiconductor layer 100$_i$ is a monocrystalline silicon layer and formed such that the first surface 11$_i$ is in a $\{110\}$ plane of the crystal lattice of the silicon layer. Consequently, in the latter example, edges of the trenches 12$_i$ between the first surface 11$_i$ and each of the first sidewall 14$_i$ and the second sidewall 15$_i$ run in a <112> direction of the trenches 12$_i$.

Figure 6C:
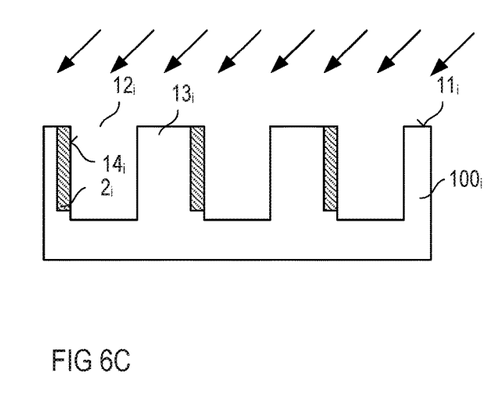
Figure 6D:
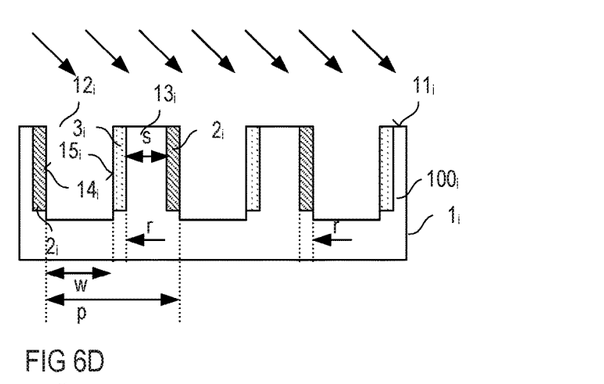

The method further includes implanting dopant atoms of at least one of a first type and a second type into at least one of the first sidewall 14$_i$ and the second sidewall 15$_i$ of each of the plurality of trenches 12$_i$. In the example method shown in FIGS. 6A to 6F, implanting the dopant atoms includes implanting first type dopant atoms into the first sidewalls 14$_i$ of the plurality of trenches 12$_i$, and implanting second type dopant atoms into the second sidewalls 15$_i$ of the plurality of trenches 12$_i$. Implanting the first type dopant atoms into the first sidewalls 14$_i$ is illustrated in FIG. 6C, and implanting the second type dopant atoms into the second sidewalls 15$_i$ is illustrated in FIG. 6D. Implanting the first type dopant atoms results in first type regions 2$_i$ along the first sidewalls 14$_i$, and implanting the second type dopant atoms results in second type regions 3$_i$ along the second sidewalls 15$_i$. In the semiconductor arrangement 1$_i$ shown in FIG. 6D, a distance between the first type region 2$_i$ at the first sidewall 14$_i$ of the trench 12$_i$ and the second type region 3$_i$ at the second sidewall 15$_i$ of the trench 12$_i$ is given by the width w of the trench 12$_i$. In FIG. 6D, s denotes the distance between the first type region 2$_i$ and the second type region 3$_i$ arranged in the same mesa region 13$_i$. Furthermore, r denotes a dimension of the first type region 2$_i$ and the second type region 3$_i$ in the first lateral direction x. According to one example, the first type region 2$_i$ and the second type region 3$_i$ are substantially equally spaced so that s≈w. This can be achieved by forming the trenches 12$_i$ with a width w which is given by w=p/2−r, where p is the pitch and r is the dimension of each of the first type regions 2$_i$ and the second type regions 3$_i$ in the first lateral direction x.

Implanting dopant atoms of at least one of a first type and a second type may comprise implanting dopant atoms of a first type and dopant atoms of a second type into the semiconductor body 10, wherein an implantation dose of at least one of the first type dopant atoms and the second type dopant atoms for each of at least two sections $Z1$, $Z2, \ldots, Zn$ of the semiconductor body 10 differs from the implantation dose of the corresponding type of dopant atoms of at least one other section of the at least two sections Z1, Z2, . . . , Zn, as has been described with respect to FIGS. 3 to 5B above. As has been explained above, either a single (first) implantation step or a first and a second implantation step may be performed. If the first type dopant atoms and the second type dopant atoms are not implanted in the same step, even more than two implantation steps may be performed overall.

The processing illustrated in FIGS. 6A-6D which includes forming the semiconductor layer $100_i$, forming a plurality of trenches $12_i$ in the first surface $11_i$ of the semiconductor layer $100_i$, and implanting dopant atoms of at least one of a first type and a second type into at least one of the first sidewall $14_i$ and the second sidewall $15_i$ of each of the plurality of trenches $12_i$ forms one of a plurality of semiconductor arrangements. A semiconductor arrangement is referred to as $1_i$ in FIG. 6D. Forming another semiconductor arrangement $1_{i+1}$ on top of the semiconductor arrangement $1_i$ shown in FIG. 6D includes the same processing as explained with reference to FIGS. 6A-6D.

In the following, two semiconductor arrangements $1_i$ formed one above the other are referred to as a pair of semiconductor arrangements, wherein the semiconductor arrangement that is formed first is referred to as bottom semiconductor arrangement and the semiconductor arrangement formed on the bottom semiconductor arrangement is referred to as top semiconductor arrangement. Consequently, the semiconductor arrangement $1_i$ shown in FIG. 6D is also referred to as bottom semiconductor arrangement, and the semiconductor arrangement $1_{i+1}$ that is formed in the processing explained with reference to FIGS. 6E-6F below is also referred to as top semiconductor arrangement. Equivalently, the semiconductor layer $100_i$ of the bottom semiconductor arrangement $1_i$ is referred to as bottom semiconductor layer $100_i$, and a semiconductor layer $100_{i+1}$ of the top semiconductor arrangement $1_{i+1}$ is referred to as top semiconductor layer. It should be noted that the terms "bottom" and "top" merely describe the relative relationship between two semiconductor arrangements, with the semiconductor arrangement referred to as "bottom semiconductor arrangement" being the one that is formed before the semiconductor arrangement referred to as "top semiconductor arrangement". That is, in a structure with more than two semiconductor arrangements, one and the same semiconductor arrangement can be referred to as top semiconductor arrangement relative to one semiconductor arrangement, and as bottom semiconductor arrangement relative to another semiconductor arrangement.

Figure 6E:
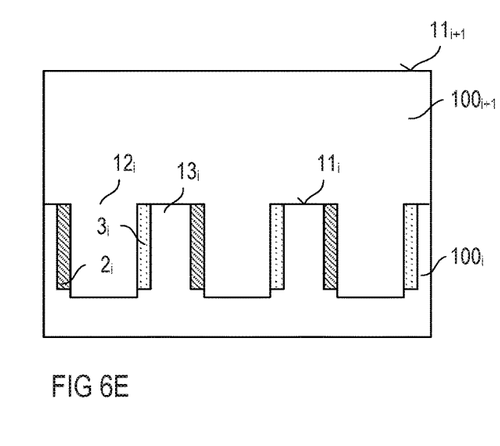

Referring to FIG. 6E, forming the top semiconductor arrangement $1_{i+1}$ includes forming a top semiconductor layer $100_{i+1}$ on the bottom semiconductor layer $100_i$. According to one example, and as shown in FIG. 6E, forming the top semiconductor layer $100_{i+1}$ on the bottom semiconductor layer $100_i$ includes forming the top semiconductor layer $100_{i+1}$ in the plurality of bottom trenches $12_i$ and on top of the bottom mesa regions $13_i$. According to one example, the top semiconductor layer $100_{i+1}$ is formed such that it completely fills the bottom trenches $12_i$ and completely covers the bottom mesa regions $13_i$. According to one example, the top semiconductor layer $100_{i+1}$ is formed to have a thickness such that the top semiconductor layer $100_{i+1}$ has a substantially planar first surface $11_{i+1}$. Optionally, the first surface $11_{i+1}$ is planarized using one of a chemical polishing process, a mechanical polishing process or a chemical-mechanical polishing (CMP) process.

According to one example, forming the top semiconductor layer $100_{i+1}$ includes epitaxially growing the top semiconductor layer $100_{i+1}$ on the bottom semiconductor layer $100_i$. If, for example, the first surface $11_i$ of the bottom semiconductor layer $100_i$ is in a {110} plane of the crystal lattice, a first surface $11_{i+1}$ of the top semiconductor layer $100_{i+1}$ is in a {110} plane of the crystal lattice of the top semiconductor layer $100_{i+1}$. According to one example, epitaxially growing the top semiconductor layer $100_{i+1}$ includes epitaxially growing the top semiconductor layer $100_{i+1}$ at a growth rate of more than 500 nanometers per minute or more than 1 micrometer per minute. The "growth rate" as defined herein is the growth rate on a horizontal surface without trenches. The growth rate on the mesa regions $13_i$ is lower as the deposited material not only grows on the mesa regions $13_i$ but also fills the trenches $12_i$.

Figure 6F:
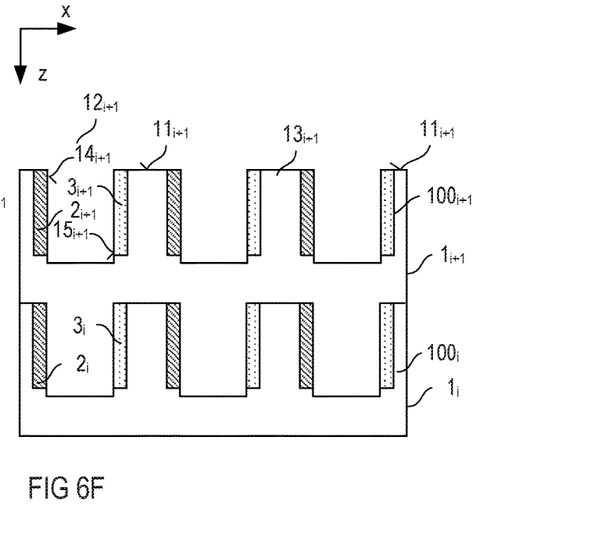

Referring to FIG. 6F, forming the top semiconductor arrangement $1_{i+1}$ further includes forming a plurality of trenches $12_{i+1}$ in a first surface $11_{i+1}$ of the top semiconductor layer $100_{i+1}$ and implanting dopant atoms of at least one of a first type and a second type into at least one of a first sidewall $14_{i+1}$ and a second sidewall $15_{i+1}$ of each of the plurality of trenches $12_{+1}$ of the top semiconductor layer $100_{i+1}$. In the example shown in FIG. 6F, like in the bottom semiconductor arrangement $1_i$, dopant atoms of the first type are implanted into the first sidewalls $14_{i+1}$ of the trenches $12_{i+1}$, and dopant atoms of the second type are implanted into the second sidewalls $15_{i+1}$ of the trenches $12_{i+1}$. Everything that is explained with reference to the trenches $12_i$ of the bottom semiconductor arrangement $1_i$ herein above applies to the trenches $12_{i+1}$ of the top semiconductor arrangement $1_{i+1}$ accordingly. According to one example, a width w of the trenches $12_{i+1}$ in the top semiconductor layer $100_{i+1}$ substantially equals the width w of the trenches $12_i$ in the bottom semiconductor layer $100_i$, and a width of the mesa regions $13_{i+1}$ of the top semiconductor layer $100_{i+1}$ substantially equals the width m of the mesa regions $13_i$ in the bottom semiconductor layer $100_i$.

According to one example, the trenches $12_{i+1}$ in the top semiconductor layer $100_{i+1}$ are formed such that the first sidewalls $14_{i+1}$ of these trenches $12_{i+1}$ are aligned with the first sidewalls $14_i$ of the trenches $12_i$ (which, when forming the trenches $12_{i+1}$, have already been filled with the top semiconductor layer $100_{i+1}$) and the second sidewalls $15_{i+1}$ of the trenches $12_{i+1}$ are aligned with the second sidewalls $15_i$ of the trenches $12_i$, so that first type regions $2_{i+1}$, resulting from implanting first type dopant atoms into the first sidewalls $14_{i+1}$ of the trenches $12_{i+1}$ in the top semiconductor arrangement $1_{i+1}$ are arranged directly above doped regions $2_i$ resulting from implanting first type dopant atoms into the first sidewalls $14_i$ of the trenches $12_i$ of the bottom semiconductor arrangement $1_i$. Equivalently, doped regions $3_{i+1}$ resulting from implanting second type dopant atoms into the second sidewalls $15_{i+1}$ of the trenches $12_{i+1}$ in the top semiconductor arrangement $1_{i+1}$ are arranged directly above doped regions $3_i$ resulting from implanting second type dopant atoms into the second sidewalls $15_i$ of the trenches $12_i$ in the bottom semiconductor arrangement $1_i$.

In FIGS. 6A-6F, the bottom semiconductor arrangement $1_i$, and the top semiconductor arrangement $1_{i+1}$ and their respective features have like reference characters that are only different in the subscript index, which is "i" in the case of the bottom semiconductor arrangement $1_i$, and "$_{i+1}$" in the case of the top semiconductor arrangement $1_{i+1}$. In the following, if explanations equivalently apply to any of the semiconductor arrangements $1_i$, $1_{i+1}$ or to a feature of any of the semiconductor arrangements $1_i$, $1_{i+1}$, reference characters without index are used. That is, any one of the plurality of the semiconductor arrangements $1_i$, $1_{i+1}$ is referred to as "the semiconductor arrangement 1", any one of the plurality of the semiconductor layers $100_i$, $100_{i+1}$ is simply referred to as "the semiconductor layer 100", any one of the plurality of the trenches $12_i$, $12_{i+1}$ in the semiconductor layers $100_i$, $100_{i+1}$ is referred to as "the trenches 12", and so on.

Although not shown in FIGS. 6A-6F, the processing explained with reference to FIGS. 6E to 6F may be repeated several times to form more than two semiconductor arrangements of the same type as the bottom semiconductor arrangement $1_i$, and the top semiconductor arrangement $1_{i+1}$ shown in these figures one above each other.

Figure 7:
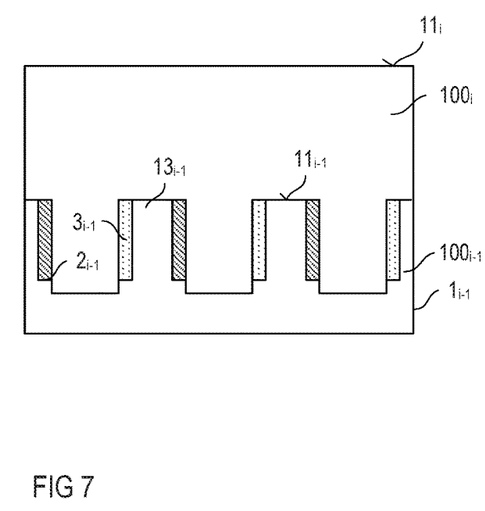
FIG. 7 shows one example of a structure below the semiconductor layer shown in FIG. 6A.

Epitaxially growing the individual semiconductor layers $10_i$, $10_{i+1}$ results in a monocrystalline layer arrangement, whereas "layer arrangement" denotes the plurality of semiconductor layers formed one above the other. In the monocrystalline layers arrangement, there is no visible border between the individual epitaxial layers. Nevertheless, just for the purpose of illustration, borders between the individual layers are illustrated by lines in FIG. 6F and the following figures. FIGS. 6A-6F do not explicitly show where the bottom semiconductor layer $100_i$ is formed. According to one example, shown in FIG. 7, the bottom semiconductor layer $100_i$ is formed on yet another semiconductor arrangement $1_{i-1}$ of the same type as the bottom and top semiconductor arrangements $1_i$, $1_{i+1}$ explained with reference to FIGS. 6A-6F. Relative to a semiconductor layer $100_{i-1}$ of this semiconductor arrangement $1_{i-1}$, the semiconductor layer $100_i$ is the top semiconductor layer.

Figure 8:
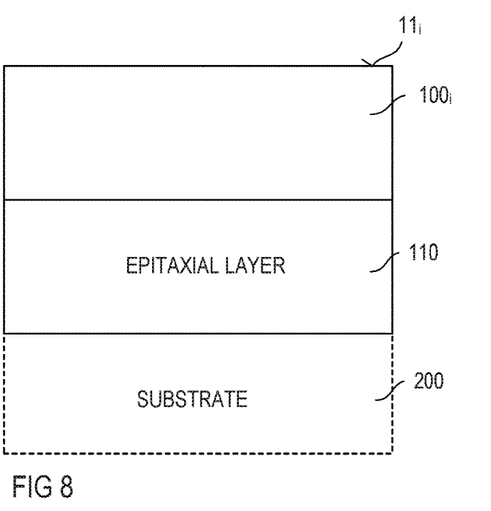
FIG. 8 shows another example of a structure below the semiconductor layer shown in FIG. 6A.
Figure 9:
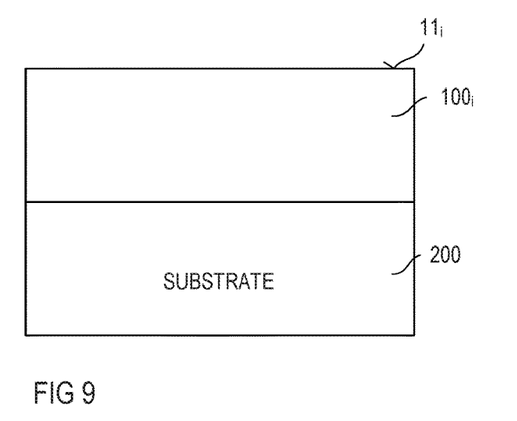
FIG. 9 shows another example of a structure below the semiconductor layer shown in FIG. 6A.

According to another example shown in FIG. 8, the bottom semiconductor layer $100_i$ is grown on an epitaxial layer 110. According to one example (illustrated in dashed lines in FIG. 10), the epitaxial layer 110 has been grown on a semiconductor substrate 200. According to one example, the epitaxial layer 110 has a substantially homogenous doping concentration.

According to yet another example shown in FIGS. 11A through 11F, the semiconductor layer $100_i$ shown in FIG. 6A is grown on a semiconductor substrate 200. A substrate 200, for example, is a piece of monocrystalline semiconductor formed by or cut from a semiconductor wafer.

Figure 10:
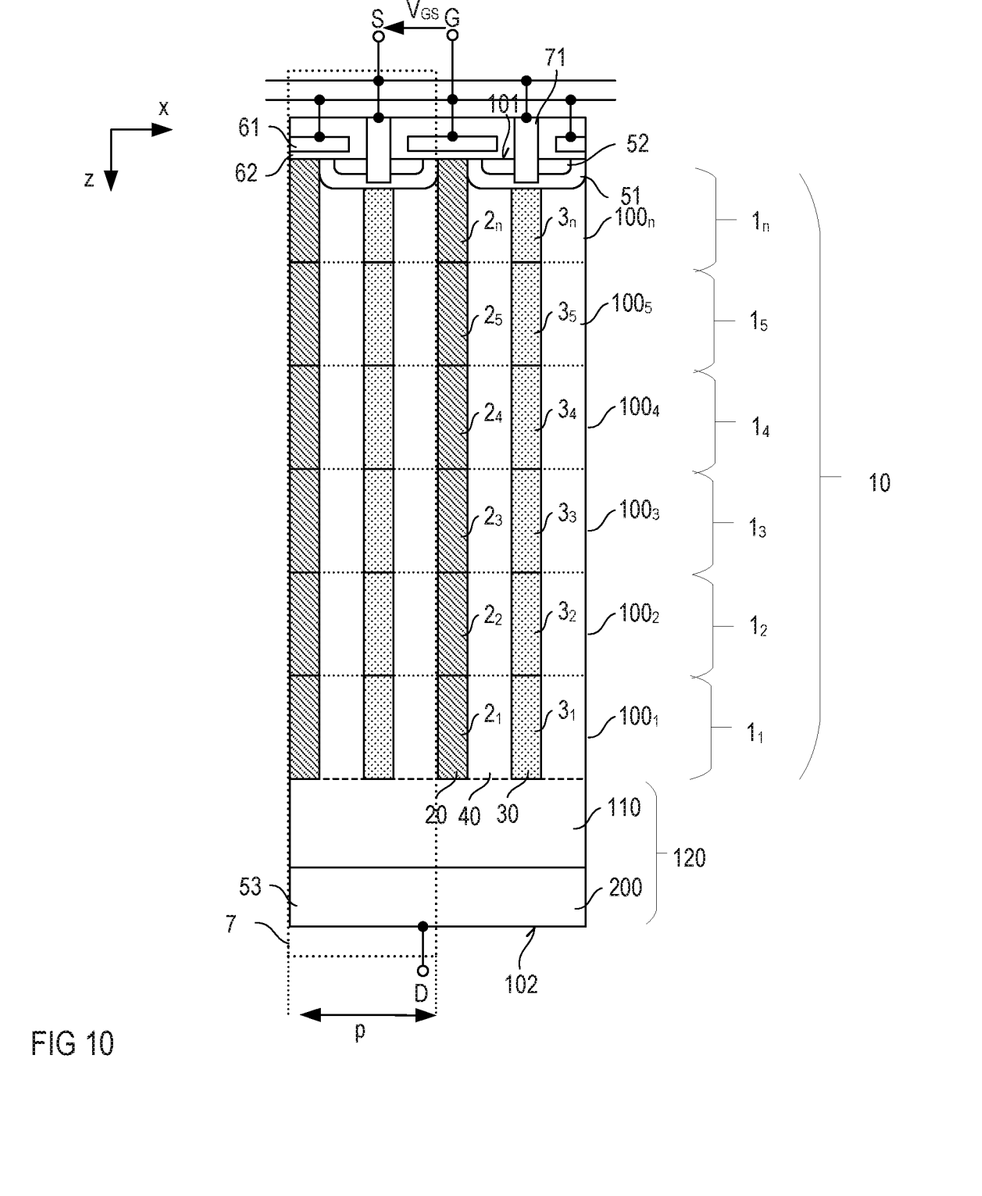
FIG. 10 shows a semiconductor device based on a structure with a plurality of semiconductor arrangements.
Figure 11A:
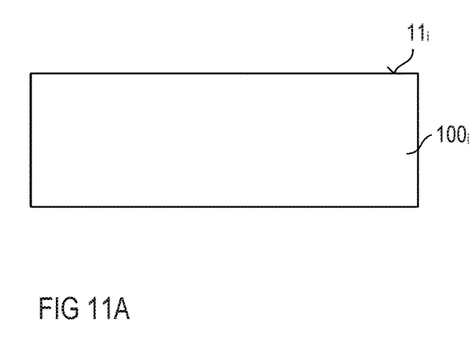
FIGS. 11A-11F illustrate another example of a method for producing a plurality of semiconductor arrangements one above the other, with each semiconductor arrangement including a semiconductor layer, a plurality of trenches in the semiconductor layer, and implanted regions along opposite sidewalls of the trenches.
Figure 11B:
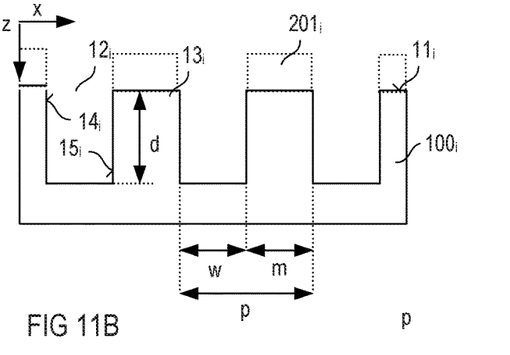
Figure 11C:
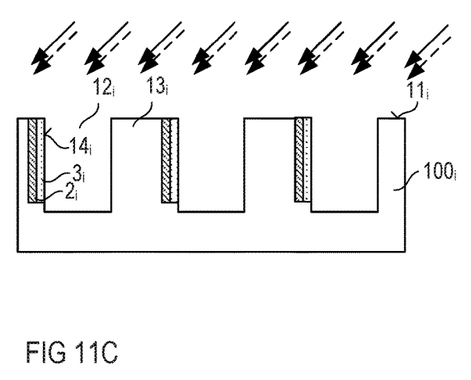
Figure 11D:
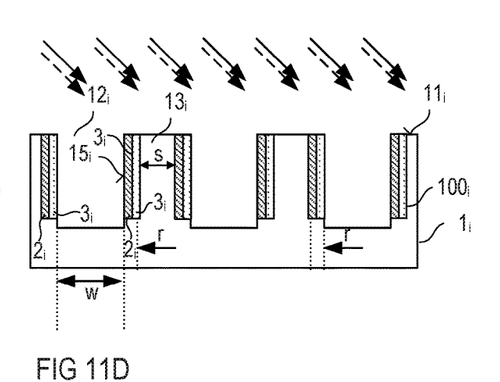
Figure 11E:
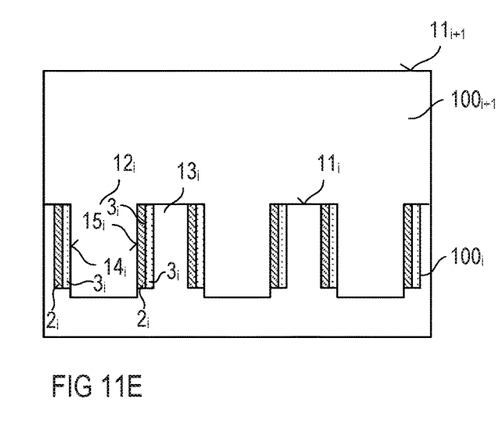
Figure 11F:
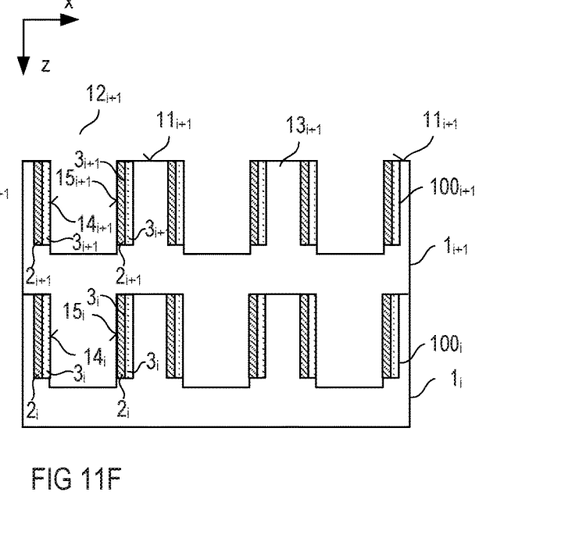

Based on the method explained with reference to FIGS. 6A-6F, a semiconductor structure with a plurality of semiconductor arrangements 1 can be formed with each of these semiconductor arrangements 1 including a plurality of first type doped regions 2 and a plurality of second type doped regions 3. Referring to the above, this semiconductor structure may form a drift region 20 of a superjunction device. FIG. 10 schematically illustrates a vertical cross-sectional view of a superjunction device that includes a plurality of n semiconductor arrangements 1 formed one above the other in a semiconductor body 10. Just for the purpose of illustration, n=6 in this example. The semiconductor device, however, may comprise any suitable number n of semiconductor arrangements, with n≥1. That is, some semiconductor devices may comprise only a single (one) semiconductor arrangement 1. Referring to FIG. 10, doped first type regions 2 of the individual semiconductor arrangements 1 are arranged one above the other in a vertical direction z, and first type regions 2 of adjoining semiconductor layers 100 adjoin each other so that those first type regions 2 that are arranged one above the other in the vertical direction z form a continuous first type region 20. Equivalently, second type regions 3 of the individual semiconductor arrangements 1 form a continuous second type region 30. The semiconductor arrangements $1_i$, $1_{i+1}$ explained with reference to FIG. 6F, represent any pair of adjacent semiconductor arrangements 1 in the superjunction device shown in FIG. 10. That is, each of the semiconductor arrangements 1 shown in FIG. 10 can be formed in accordance with the method shown in FIGS. 6A-6F. Referring to FIG. 6F, first type regions 2 in adjacent semiconductor arrangements 1 can be produced to be spaced apart in the vertical direction z. Equivalently, second type regions 3 in adjacent semiconductor arrangements 1 can be produced to be spaced apart in the vertical direction z. From the structure shown in FIG. 6F, a structure with adjoining first type regions 2 and adjoining second type regions 3 as shown in FIG. 10 can be obtained by an annealing process in which the implanted dopant atoms diffuse in the vertical direction z (and the first lateral direction x) and are electrically activated (by being incorporated into substitutional sites of a crystal lattice of the semiconductor layers 100). According to one example, one common annealing process is performed to diffuse and activate the dopant atoms in each of the plurality of semiconductor arrangements 1 formed one above the other. According to one example, a temperature in the annealing process that causes the dopant atoms to diffuse and to be activated is below 1300° C. and, in particular, between 1100° C. and 1300° C. A duration of the annealing process may be between 30 minutes and 10 hours (600 minutes).

The drift region shown in FIG. 10 includes a lowermost semiconductor arrangement $1_1$. This lowermost semiconductor arrangement $1_1$—which may also be referred to as a first semiconductor arrangement as it is the first semiconductor arrangement that is formed—is formed on a substrate 200 or (as shown) on an optional epitaxial layer 110 formed on the substrate 200.

The superjunction device shown in FIG. 10 is implemented as a MOSFET. In this case, the substrate 200 forms a drain region 53 that is connected to a drain node D (which is only schematically illustrated in FIG. 10) of the MOSFET. The MOSFET may include a plurality of device cells 7, whereas two of such device cells 7 are shown in FIG. 10. In the example illustrated in FIG. 10, each of these device cells 7 includes one first type region 20 and one second type region 30. The plurality of device cells 7 share the drain region 53 and the epitaxial layer 110, whereas the epitaxial layer 110 is part of the drift region of the superjunction MOSFET.

Each device cell (transistor cell) 7 further includes a source region 52, a body region 51 separating the source region 52 from the drift region, and a gate electrode 61 dielectrically insulated from the body region 51 by a gate dielectric 62. The gate electrodes 61 of the individual device cells 7 are electrically connected to a common gate node G, and the source and body regions 51, 52 of the individual device cells 7 are electrically connected to a source node S via respective source electrodes or contact plugs 71. The second type region 30 of each device cell 7 adjoins the body region 51, according to one example. The gate electrode 61 serves to control a conducting channel in the body region 51 between the source region 52 and the drift region, in particular the second type region 20 of the drift region.

The body regions 51 and the source regions 52 can be formed in the uppermost semiconductor arrangement $1_n$ by at least one of an implantation and a diffusion process. Before this at least one implantation and diffusion process, the trenches (corresponding to the trenches $12_{i+1}$ shown in FIG. 6F) of the uppermost semiconductor arrangement $1_n$ can be filled in accordance with the process explained with reference to FIG. 6E, that is, by epitaxially growing a semiconductor layer that fills the trenches $12_{i+1}$ and, optionally, planarizing this semiconductor layer. The source and body regions 51, 52 may then be formed using at least one of an implantation and diffusion process in this semiconductor layer. The epitaxial layer in which the source and body regions 51, 52 are formed may be thinner in the vertical direction z than the epitaxial layers explained before. According to one example, a thickness of this epitaxial layer 100n is between 1 and 3 micrometers, in particular, about 2 micrometers. The gate dielectric 62 includes an oxide, for example, and may be formed using an oxidation or deposition process. The gate electrode 61, for example, includes one of a metal and a highly doped polycrystalline semiconductor material such as, e.g., polysilicon.

As has been described with respect to FIG. 1 above, the superjunction MOSFET can be an n-type MOSFET or a p-type MOSFET. The superjunction MOSFET can be operated in an on-state or an off-state. In the on-state, the gate electrode 61, driven by a drive voltage VGS applied between the gate node G and the source node S, generates a conducting channel in the body region 51 between the source region 52 and the first type region 20 so that upon applying a voltage between the drain node D and the source node S a current can flow between the drain node D and the source node S. In the off-state, the gate electrode 61 is driven such that the conducting channel in the body region 51 is interrupted. For the purpose of explanation it is assumed that the MOSFET is in the off-state and a voltage is applied between the drain node D and the source node S that reverse biases a pn-junction between the body region 51 and the first type region 20 and a pn-junction between the first type region 20 and the second type region 30. In this case, space charge regions expand in the first type region 20, the body region 51, and also the second type region 30, whereas the first type regions 20 and the second type regions 30 may be completely depleted. According to one example, a doping concentration of the body region 51 is high enough for the body region 51 to not be depleted completely.

In the annealing process explained above, the first type regions 2 and the second type regions 3 may diffuse in the first lateral direction x such that first type regions and second type regions adjoin each other (see, e.g., FIG. 1). According to another example, shown in FIG. 10, regions 40 having a basic doping of the respective semiconductor layers 100 may remain between the first type regions 2 and the second type regions 3. The basic doping is a doping the semiconductor layers 100 have before the first type regions 2 and the second type regions 3 are formed.

According to one example, the semiconductor layers 100 are non-doped. As used herein, "non-doped" means that semiconductor layers 100 have a basic doping of less than 8E13 $cm^{-3}$ or even less than 2E13 $cm^{-3}$.

One figure of merit of a superjunction MOSFET is the specific on-resistance $R_{DS\_ON}*A$, which is the on-resistance $R_{DS\_ON}$ multiplied with the semiconductor area A consumed by the superjunction device in a plane perpendicular to the vertical direction z shown in FIG. 10. The specific on-resistance can be decreased by decreasing the pitch p, whereas the pitch, as shown in FIG. 10, is given by a distance between same device structures, such as first type regions 20, in the first lateral direction x. By the method explained with reference to FIGS. 6A-6F, a drift region with a relatively small pitch p can be produced because by virtue of implanting the dopant atoms into the sidewalls of the trenches 12 the doped regions mainly extend in the vertical direction z (in the first lateral direction x, a dimension of the doped regions is significantly smaller than the trench width as shown in FIG. 6D) and there is no need to diffuse the introduced dopant atoms deep into the respective semiconductor layer 100 in order to form contiguous first type and second type regions 20, 30. Furthermore, the implantation process allows to exactly control the amount of first type dopant atoms and second type dopant atoms introduced into the respective semiconductor layer 100. By this, the overall amount of first type dopant atoms and second type dopant atoms in each horizontal plane of the drift region can be exactly controlled. The "horizontal plane" is a plane perpendicular to the section plane shown in FIG. 10.

In the example illustrated in FIG. 10, the gate electrode 61 of each device cell 7 is a planar electrode that is arranged above a first surface 101 of the layer arrangement. This, however, is only an example. According to another example, the gate electrode of each device cell 7 is a trench electrode. That is, the gate electrode 61 is arranged in a trench above the first type region 20 and adjacent the body region 51 and the source region 52, and the gate electrode 61 is dielectrically insulated from these regions by a gate dielectric 62.

In the example illustrated in FIGS. 6A-6F, first type dopant atoms are implanted only into the first sidewalls 14 of the trenches 12, and second type dopant atoms are implanted only into the second sidewalls 15 of the trenches 12. This, however, is only an example. FIGS. 11A-11F show a modification of the method shown in FIGS. 6A-6F. In the method shown in FIGS. 11A-11F, first type dopant atoms are implanted into both the first sidewall 14 (see FIG. 11C) and the second sidewall 15 (see FIG. 11D). The same applies for the second type dopant atoms which are also implanted into both the first sidewall 14 (see FIG. 11C) and the second sidewall 15 (see FIG. 11D). According to one example, the first type dopant atoms may be implanted deeper into the first sidewall 14 than the second type dopant atoms, and the second type dopant atoms may be implanted deeper into the second sidewalls 15 than the first type dopant atoms. In this way, distinctive first type regions 2 and second type regions 3 may be formed in the first and second sidewalls 14, 15. During the annealing process, as has been described above, the implanted dopant atoms may diffuse in the vertical direction z as well as in the first lateral direction x and are electrically activated, thereby forming the drift regions 20 and compensation regions 30 (see, e.g., FIGS. 1 and 10).

According to another example, not specifically illustrated, a method may include implanting both first type dopant atoms and second type dopant atoms into at least one of the first sidewall 14 and the second sidewall of the trenches 12. This may result in a combined first and second type region 23 which includes both dopant atoms of the first type and the second type. The method further includes annealing the semiconductor structure to diffuse the first type dopant atoms and the second type dopant atoms in the semiconductor structure. The first type dopant atoms and the second dopant type atoms may be chosen such that they have different diffusion coefficients so that the annealing process, based on the implanted regions 23 results in adjoining first type semiconductor regions 20 and second type semiconductor regions 30. According to one example, the diffusion constant of one of the first type dopant atoms and the second type dopant atoms is at least 4 times or at least 6 times the diffusion constant of the other one of the first type dopant atoms and the second type dopant atoms. Pairs of dopant atoms that have different diffusion constants are boron (B) and arsenic (As), or boron (B) and antimony (Sb), for example. Boron is a p-type dopant, arsenic and antimony are n-type dopants. In each of these pairs, boron is the dopant with the higher diffusion coefficient. A ratio of the respective diffusion coefficients of boron and arsenic, for example, is 8:1. That is, boron diffuses eight times as fast as arsenic.

According to one example, the method includes one annealing process after manufacturing the complete layer arrangement. That is, after all of the plurality of epitaxial layers have been formed, the dopant atoms are diffused in each of the plurality of semiconductor layers 100.

An implantation angle in the described implantation processes may be selected such that dopant atoms are implanted into the sidewalls 14, 15, but not the bottom of the trench 12. When implanting the dopant atoms at a certain (flat) angle, the dopant atoms may not be implanted very deep into the sidewalls 14, 15. At least some of the dopant atoms are rather implanted close to a surface of the sidewalls 14, 15. This increases the risk of outgassing. During the annealing process, as has been described above, the implanted dopant atoms may diffuse in the vertical direction z as well as in the first lateral direction x and are electrically activated, thereby forming the drift regions 20 and compensation regions 30. As has further been described above, a temperature in the annealing process may be between 1100° C. and 1300° C. A duration of the annealing process may be between 30 minutes and 10 hours (600 minutes). As the dopant atoms are usually implanted close to the surface of the sidewalls 14, 15, and under the influence of the high temperatures especially during the annealing process, the effect of outgassing may occur. Some dopant atoms are even more prone to the effect of outgassing than others. For example, boron is usually more prone to outgassing than arsenic and antimony.

The methods described above may reduce or even eliminate the unwanted variations of the doping concentration due to outgassing. The outgassing itself is not prevented. However, if the degree of outgassing is known for each section of a semiconductor body 10 or wafer, the implantation dose during the implantation step may be adjusted accordingly. That is, if it is known how many dopant atoms will be affected by the outgassing effect in a certain section, the initial implantation dose may be adjusted accordingly. In sections that are more prone to outgassing, the initial implantation dose may be higher than in other sections that are less prone to outgassing. In this way, the resulting doping concentration of the finished semiconductor device may be essentially uniform over the complete semiconductor body or wafer.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a semiconductor device, the method comprising:
   forming a plurality of transistor cells in a semiconductor body, each transistor cell comprising a source region, a body region, a drift region separated from the source region by the body region, a gate electrode dielectrically insulated from the body region, and a compensation region of a doping type complementary to the doping type of the drift region and extending from a respective body region into the drift region in a vertical direction, wherein forming a plurality of the drift regions and a plurality of the compensation regions comprises:
   forming a semiconductor arrangement, wherein forming the semiconductor arrangement comprises:
   forming a semiconductor layer; and
   forming a plurality of trenches in a first surface of the semiconductor layer; and
   performing a first implantation step, thereby implanting dopant atoms of a first type and dopant atoms of a second type into at least one of a first sidewall and a second sidewall of each of the plurality of trenches, wherein an implantation dose of at least one of the first type dopant atoms and the second type dopant atoms for each of at least two sections of the semiconductor body differs from the implantation dose of the corresponding type of dopant atoms of at least one other section of the at least two sections, wherein the at least two sections are arranged successively in a horizontal direction.

2. The method of claim 1, wherein:
   the implantation dose of the first type dopant atoms is essentially homogenous within each of the at least two sections; and
   the implantation dose of the second type dopant atoms is essentially homogenous within each of the at least two sections.

3. The method of claim 1, wherein within at least one of the at least two sections of the semiconductor body, the implantation dose of the first type dopant atoms differs from the implantation dose of the second type dopant atoms.

4. The method of claim 1, wherein the different sections of the semiconductor body are arranged in a radially symmetrical pattern, and therefore, performing the first implantation step results in a radially symmetrical distribution of at least one of the first type dopant atoms and the second type dopant atoms within the semiconductor body.

5. The method of claim 1, further comprising:
   performing a second implantation step, thereby implanting dopant atoms of the first type and dopant atoms of the second type into the semiconductor body,
   wherein an implantation dose of the first type dopant atoms of each of the at least two sections is equal to the implantation dose of the corresponding type of dopant atoms of each of the other sections; and
   an implantation dose of the second type dopant atoms of each of the at least two sections is equal to the implantation dose of the corresponding type of dopant atoms of each of the other sections.

6. The method of claim 5, wherein
   the first implantation step is performed after the second implantation step.

7. The method of claim 5, wherein:
   during the first implantation step, about 2% to 10% of a total implantation dose of each of the first type dopant atoms and the second type dopant atoms are implanted for each of the at least two sections; and
   during the second implantation step, about 90% to 98% of a total implantation dose of each of the first type dopant atoms and the second type dopant atoms are implanted for each of the at least two sections, such that after performing both the first and the second implantation step, 100% of the total implantation dose of each of the first type dopant atoms and the second type dopant atoms are implanted for each of the at least two sections.

8. The method of claim 1, wherein forming the plurality of drift regions and the plurality of compensation regions further comprises:

forming a plurality of semiconductor arrangements one above the other, wherein forming each of the plurality of semiconductor arrangements comprises:
forming a semiconductor layer;
forming a plurality of trenches in a first surface of the semiconductor layer; and
implanting the dopant atoms of at least one of the first type and the second type into at least one of a first sidewall and a second sidewall of each of the plurality of trenches of the semiconductor layer.

9. The method of claim 8, wherein forming the semiconductor layer comprises epitaxially growing the semiconductor layer.

10. The method of claim 8, wherein implanting the dopant atoms comprises:
implanting dopant atoms of the first type into the first sidewall; and
implanting dopant atoms of the second type into the second sidewall.

11. The method of claim 8, wherein implanting the dopant atoms comprises:
implanting dopant atoms of both the first type and the second type into at least one of the first sidewall and the second sidewall.

12. The method of claim 1, further comprising:
annealing the semiconductor body to diffuse the dopant atoms.

13. The method of claim 1, wherein each of the at least two sections comprises a subset of the plurality of transistor cells.

14. The method of claim 1, wherein
the first implantation step comprises implanting the first type dopant atoms during a first sub-process and implanting the second type dopant atoms in a separate second sub-process.

15. The method of claim 14, wherein the first implantation step comprises performing the first sub-process after the second sub-process.

* * * * *